(12) United States Patent
Huang et al.

(10) Patent No.: US 6,291,288 B1
(45) Date of Patent: Sep. 18, 2001

(54) METHOD OF FABRICATING A THIN AND STRUCTURALLY-UNDEFECTIVE DIELECTRIC STRUCTURE FOR A STORAGE CAPACITOR IN DYNAMIC RANDOM-ACCESS MEMORY

(75) Inventors: Kuo-Tai Huang, Hsinchu; Tri-Rung Yew, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/292,537

(22) Filed: Apr. 15, 1999

(51) Int. Cl.$^7$ .................................................. H01L 21/8242
(52) U.S. Cl. ................................................................ 438/239
(58) Field of Search ..................... 438/239, 724, 438/744, 756, 757, 775, 787, 791, 386, 387

(56) References Cited

U.S. PATENT DOCUMENTS

| | | | |
|---|---|---|---|
| 4,996,081 | * | 2/1991 | Ellul et al. ............................ 427/96 |
| 5,913,149 | * | 6/1999 | Thakur et al. ....................... 438/762 |
| 6,063,713 | * | 5/2000 | Doan .................................... 438/736 |
| 6,077,754 | * | 6/2000 | Srinivasan et al. .................. 438/396 |

* cited by examiner

Primary Examiner—David Nelms
Assistant Examiner—Quoc Hoang

(57) ABSTRACT

A semiconductor fabrication method is provided for the fabrication of a dielectric structure for a storage capacitor in dynamic random-access memory (DRAM). In particular, the resultant dielectric structure can be fabricated thinner and more structurally-undefective than the prior art. By the method, a first nitridation process is performed to form a dielectric layer over a bottom electrode. Next, a layer of silicon nitride is formed over the dielectric layer. This silicon nitride layer would be typically formed with an undesired rugged surface with many punctures. To eliminate this structural defect, a second nitridation process is performed on the silicon nitride layer. The resultant silicon nitride layer and the dielectric layer in combination constitute an ON structure serving as the intended dielectric structure. Alternatively, an oxide layer can be further formed over the silicon nitride layer to constitute an ONO structure serving as the intended dielectric structure. The second nitridation process can be carried out either through a rapid thermal treatment process with the use of nitrogen, ammonia, or a mixture of nitrogen and ammonia; or alternatively through a nitrogen plasma treatment process.

14 Claims, 4 Drawing Sheets

METHOD OF FABRICATING A THIN AND STRUCTURALLY-UNDEFECTIVE DIELECTRIC STRUCTURE FOR A STORAGE CAPACITOR IN DYNAMIC RANDOM-ACCESS MEMORY

BACKGROUND OF THE INVENTION

1. Field of the Invention

This invention relates to integrated circuit (IC) fabrication technology, and more particularly, to a method of fabricating a dielectric structure for a storage capacitor in dynamic random-access memory (DRAM).

2. Description of Related Art

With the advent of advanced and state-of-the-art semiconductor fabrication technologies, IC devices are now being downsized to the submicron or even deep submicron levels of integration to provide extremely high packing densities of transistor elements therein. In the case of DRAM, however, the downsizing would also reduce the capacitance of its storage capacitor, resulting in a degraded data retaining capability.

The storage capacitor in each DRAM cell is composed of a pair of oppositely arranged electrodes and a dielectric structure sandwiched therebetween. Fundamentally, the data retaining capability of the DRAM increases with the capacitance of its storage capacitor; and the capacitance of the storage capacitor is proportional to the dielectric constant of the dielectric structure and inversely proportional to the thickness of the dielectric structure. The dielectric structure is typically formed from silicon oxide or silicon nitride. Silicon oxide has a dielectric constant of about 3.8, and silicon nitride has a dielectric constant of about 7. Therefore, silicon nitride is more preferable than silicon oxide as the dielectric material used to form DRAM's storage capacitor.

A silicon nitride based dielectric layer is conventionally formed through a low-pressure chemical-vapor disposition (LPCVD) process, with $SiH_2Cl_2$ or $SiH_4$ serving as the reactant to be reacted with $NH_3$ for the forming of silicon nitride. One drawback to the use of LPCVD process to form silicon nitride based dielectric layer, however, is that when the thickness is downsized to below 200 Å, it would cause the resultant silicon nitride layer to be formed with an undesired rugged surface with many punctures, which would make the resultant storage capacitor to suffer from leakage current, and thus unreliable to use. This structural defect can be eliminated by increasing the thickness of the silicon nitride layer. However, this would make the resultant storage capacitor low in capacitance.

One solution to the foregoing problem is to use an ONO dielectric structure, which is a stacked structure consisting of a first oxide layer (O), a silicon nitride layer (N) over the first oxide layer, and a second oxide layer (O) over the silicon nitride layer. Typically, the first oxide layer is a primitive oxide layer; while the second oxide layer is formed through a wet-oxidation process, by which the wafer is placed in an oven with water serving as the oxidant to undergo a thermal oxidation process at a temperature of 800° C. for a continuous period of about 30 minutes. This process can help mend the above-mentioned structural defect in the resultant silicon nitride layer to prevent the leak-age problem.

One drawback to the foregoing method, however, is that the effective dielectric constant of the overall dielectric structure would be decreased due to the use of two oxide layers and the increased thickness from the wet-oxidation process. The capacitance of the resultant storage capacitor is therefore still unsatisfactorily low.

There exists, therefore, a need for a new semiconductor fabrication method that can allow the dielectric structure between the electrodes of a storage capacitor in DRAM to be as thin as possible while nevertheless allowing the resultant dielectric structure to be substantially free from the above-mentioned structural defect.

SUMMARY OF THE INVENTION

It is therefore an objective of this invention to provide a method for fabricating a dielectric structure for a storage capacitor in DRAM, which allows the resultant dielectric structure to be thinner as compared to the prior art to the level of from 30 Å to 50 Å so as to provide a high dielectric constant to allow a high capacitance for the DRAM's storage capacitor.

It is another objective of this invention to provide a method for fabricating a di-electric structure for a storage capacitor in DRAM, which allows the resultant dielectric structure to be substantially free from such a structural defect as a rugged surface with punctures so as to allow the resultant DRAM to be free from leakage problem.

In accordance with the foregoing and other objectives of this invention, an improved semiconductor fabrication method is provided for fabricating a dielectric structure for a storage capacitor in DRAM.

The method of the invention is used to fabricate a dielectric structure between a first electrode and a second electrode for a storage capacitor in DRAM. The first electrode is formed with a primitive oxide layer thereon. The method of the invention comprises the steps of: (1) removing the primitive oxide layer; (2) performing a first nitridation process to form a dielectric layer over the first electrode; (3) forming a layer of silicon nitride over the dielectric layer; and (4) performing a second nitridation process on the silicon nitride layer, with the resultant silicon nitride layer and the dielectric layer in combination constituting an ON structure serving as the intended dielectric structure. Alternatively, an oxide layer can be further formed over the silicon nitride layer, with the dielectric layer, the silicon nitride layer, and the oxide layer in combination constituting an ONO structure serving as the intended dielectric structure.

The second nitridation process can be carried out either through a rapid thermal treatment process with the use of a reactant selected from nitrogen, ammonia, and a mixture of nitrogen and ammonia under a temperature of from 800° C. to 1,000° C. for a continuous period of from 30 to 60 seconds; or through a nitrogen plasma treatment process under a temperature of from 400° C. to 600° C.

The method of the invention has the following advantages over the prior art. First, the invention can help improve the structural quality of the silicon nitride layer, allowing the resultant silicon nitride layer to be formed substantially without a rugged surface with punctures. This not only can help solve the leakage problem of the prior art, but also can help further downsize the thickness of the silicon nitride layer, resulting in a larger capacitance for the DRAM data storage capacitor. Second, the step of forming a silicon oxide layer can be eliminated. Moreover, the thinning of the primitive oxide layer can also help downsize the overall thickness of the dielectric structure so that the capacitance of the resultant storage capacitor can be increased. Third, the use of rapid thermal treatment or nitrogen plasma treatment under low temperature conditions allows a low thermal budget to the fabrication of the storage capacitor and also helps to improve the short-channel effect between the source and drain of each transistor element in the DRAM that would otherwise occur due to multiple thermal treatment steps to the impurity-doped regions. Fourth, the invention allows the overall fabrication process to be easier to carry out due to the fact that the step of performing the first nitridation process to the step of forming the second electrode can be all carried out on the same platform without having to redispose the wafer from the vacuum chamber.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Preferred embodiments of the method of the invention for fabricating a dielectric structure for a storage capacitor in DRAM are disclosed in full details in the following with reference to FIGS. 1–8.

Figure 1:
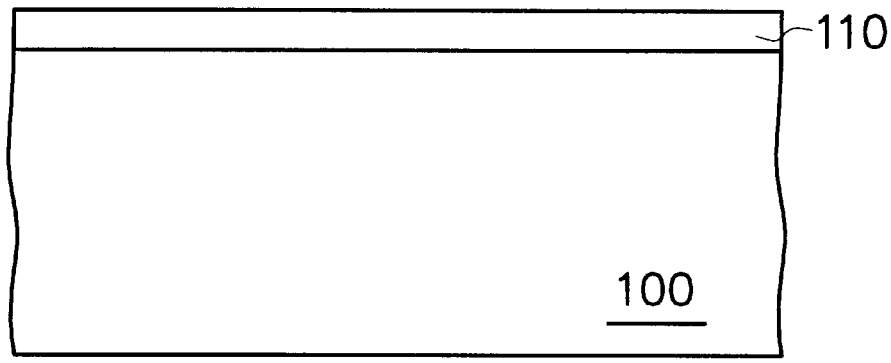
FIG. 1 through FIG. 8 are schematic sectional diagrams used to depict the steps involved in the method of the invention for fabricating a dielectric structure for a storage capacitor in DRAM.

Referring first to FIG. 1, the method of the invention is intended to be utilized on a semiconductor wafer which is already formed with a first electrode 100. The first electrode 100 can be formed, for example, from polysilicon. When exposed to air, a primitive oxide layer 110 would be formed over the first electrode 100, typically to a thickness of from 15 Å to 20 Å (angstrom).

Figure 2:
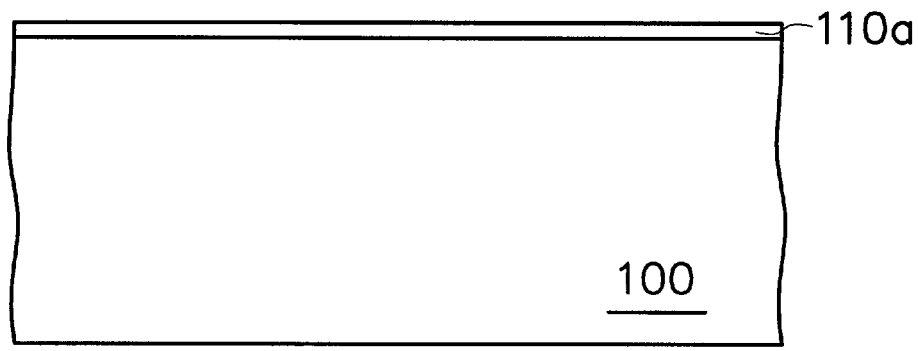

Referring next to FIG. 2, in the subsequent step, an aqueous solution of hydrofluoric (HF) acid of about 1% in concentration is used to etch away the primitive oxide layer 110; and then, an RCA-C solution is used to wash away remnant particles from the wafer surface. Through this process, the primitive oxide layer 110 may be entirely or partly removed. When partly removed, a small thickness of the primitive oxide layer 110, about from 8 Å to 10 Å, would remain over the first electrode 100 (the remaining part of the primitive oxide layer 110 is herein and hereinafter designated by the reference numeral 110a for distinguishing purpose).

Figure 3:
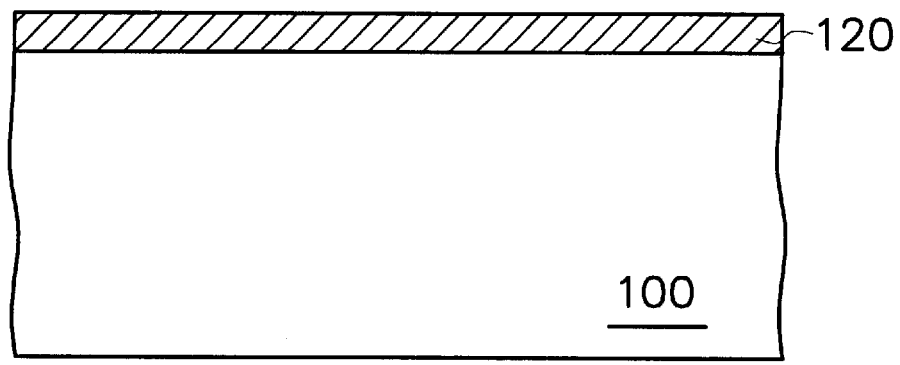

Referring further to FIG. 3, in the subsequent step, a first nitridation process is performed on the wafer so as to convert the remaining primitive oxide layer 110a into a dielectric layer 120 of a thickness of about 20 Å. The first nitridation process can be carried out in various ways. For example, it can be carried out through rapid thermal treatment with the use of nitrogen, or ammonia, or a mixture of nitrogen and ammonia, under a temperature of from 750° C. to 1,000° C. for a continuous period of from 30 to 90 seconds. Alternatively, the first nitridation process can be carried out through nitrogen plasma treatment. Moreover, the first nitrification process can be carried out through rapid-rising thermal treatment with a rate of temperature change of 100° C./min until reaching a specified temperature level of from 700° C. to 850° C. Still moreover, the first nitridation process can be carried out through a load-lock system nitridation process.

It is to be noted that, in the case of the primitive oxide layer 110 (FIG. 1) being partly removed through the step of FIG. 2, the dielectric layer 120 is formed from silicon-oxy-nitride; and whereas in the case of the primitive oxide layer 110 (FIG. 1) being entirely removed through the step of FIG. 2, the dielectric layer 120 is formed from silicon nitride.

Figure 4:
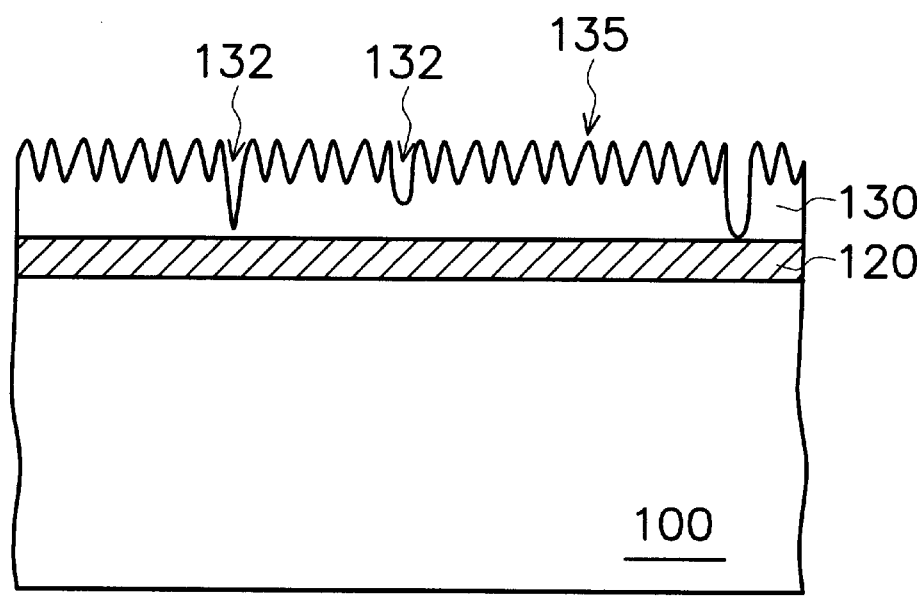

Referring next to FIG. 4, in the subsequent step, a layer of silicon nitride 130 is formed over the dielectric layer 120 to a thickness of from 30 Å to 50 Å through an LPCVD process. The LPCVD process can be performed, for example, with the use of a mixture of gaseous $SiH_2Cl_2$ and $NH_3$, or a mixture of gaseous $SiH_4$ and $NH_3$, under a temperature of from 600° C. to 750° C. and a pressure of from 0.1 torr to 1 torr. As mentioned in the background section of this specification, however, the LPCVD process would cause the resultant silicon nitride layer 130 to be undesirably formed with a rugged surface 135 with many punctures 132, some of which may even penetrate through the silicon nitride layer 130 and thereby expose the underlying dielectric layer 120. This structural defect is due to the incomplete reaction between nitrogen and silicon, causing many Si—H bonds to be incompletely reacted into Si—N bonds.

Figure 5:
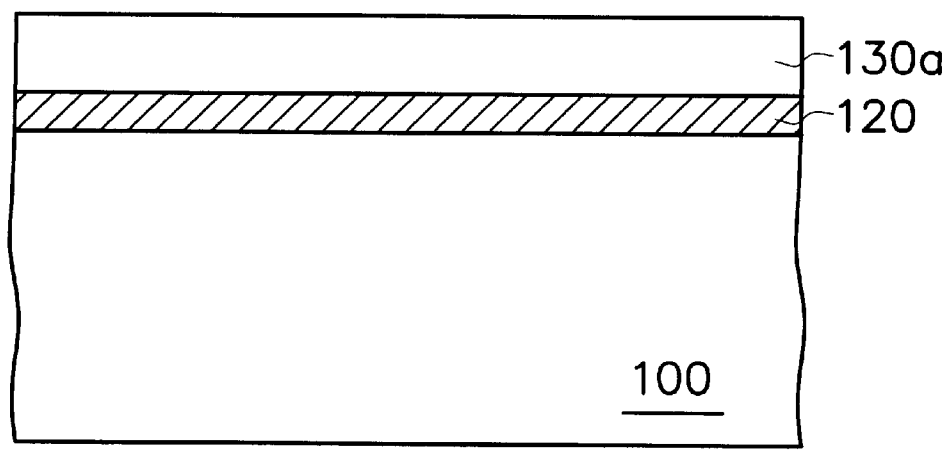

Referring further to FIG. 5, in the subsequent step, it is a characteristic feature of the invention that a second nitridation process is performed on the wafer so as to cause the unreacted Si—H bonds in the silicon nitride layer 130 to be completely reacted into Si—N bonds, whereby the rugged surface 135 of the silicon nitride layer 130 (FIG. 4) can be substantially smoothened and all the punctures 132 in the silicon nitride layer 130 (FIG. 4) can be substantially filled up (the now structurally-undefective silicon nitride layer is herein and hereinafter designated instead by the reference numeral 130a for distinguishing purpose). The dielectric layer 120 and the silicon nitride layer 130a in combination constitute an ON dielectric structure having a thickness of from 50 Å to 70 Å over the first electrode 100.

The second nitridation process can be carried out, for example, through rapid thermal treatment with a mixture of gaseous nitrogen and ammonia under a temperature of from 800° C. to 1,000° C. for a continuous period of from 30 to 60 seconds. Alternatively, the nitridation process can be carried out through nitrogen plasma treatment under a temperature of from 400° C. to 600° C.

Figure 6:
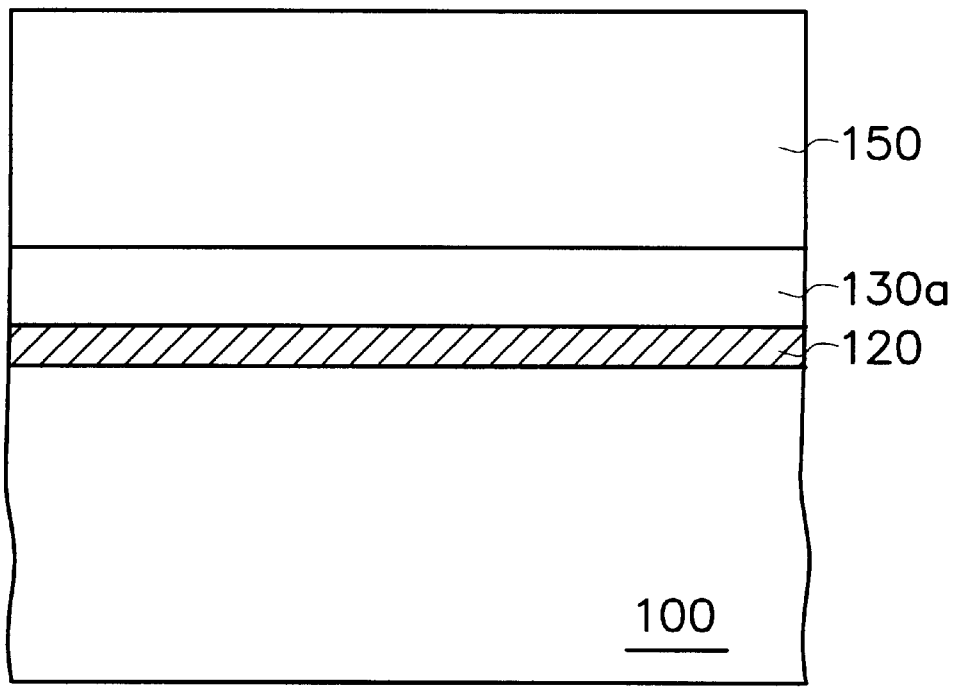

Referring further to FIG. 6, in the subsequent step, a second electrode 150 is formed from polysilicon over the silicon nitride layer 130a through, for example, a CVD process. In this CVD process, for example, a mixture of gaseous $SiH_4$ and $SiH_2Cl_2$, or a mixture of gaseous $Si_2H_6$ and $H_2$, is used as the reactant.

Figure 7:
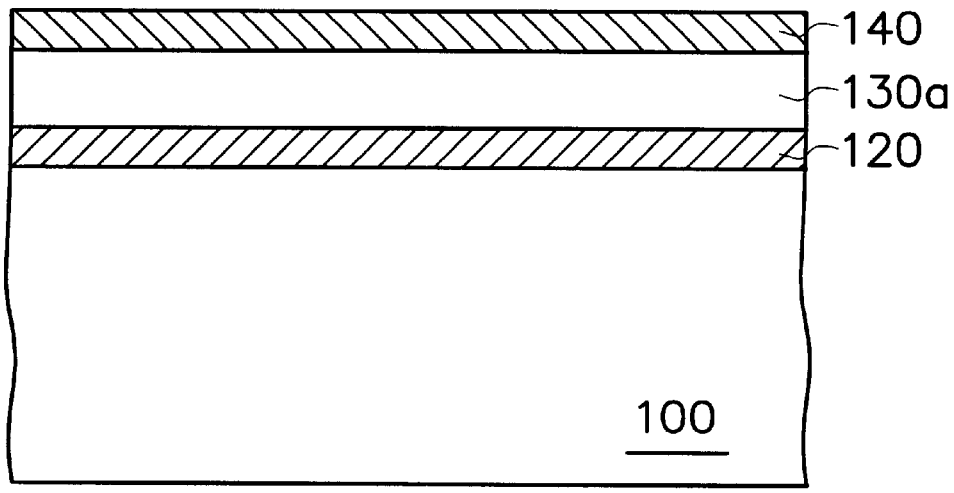

Alternatively, as shown in FIG. 7, after the step of FIG. 5, an oxide layer 140 can be formed over the silicon nitride layer 130a to constitute an ONO dielectric structure (i.e., the combined structure of the dielectric layer 120, the silicon nitride layer 130a, and the oxide layer 140) over the first electrode 100. The oxide layer 140 can be formed, for example, through a rapid thermal process with the use of $N_2O$, or $O_2$, or a mixture of $N_2O$ and $O_2$ as the reactant, under a temperature of from 800° C. to 900° C. for a continuous period of from 30 to 60 seconds.

Figure 8:
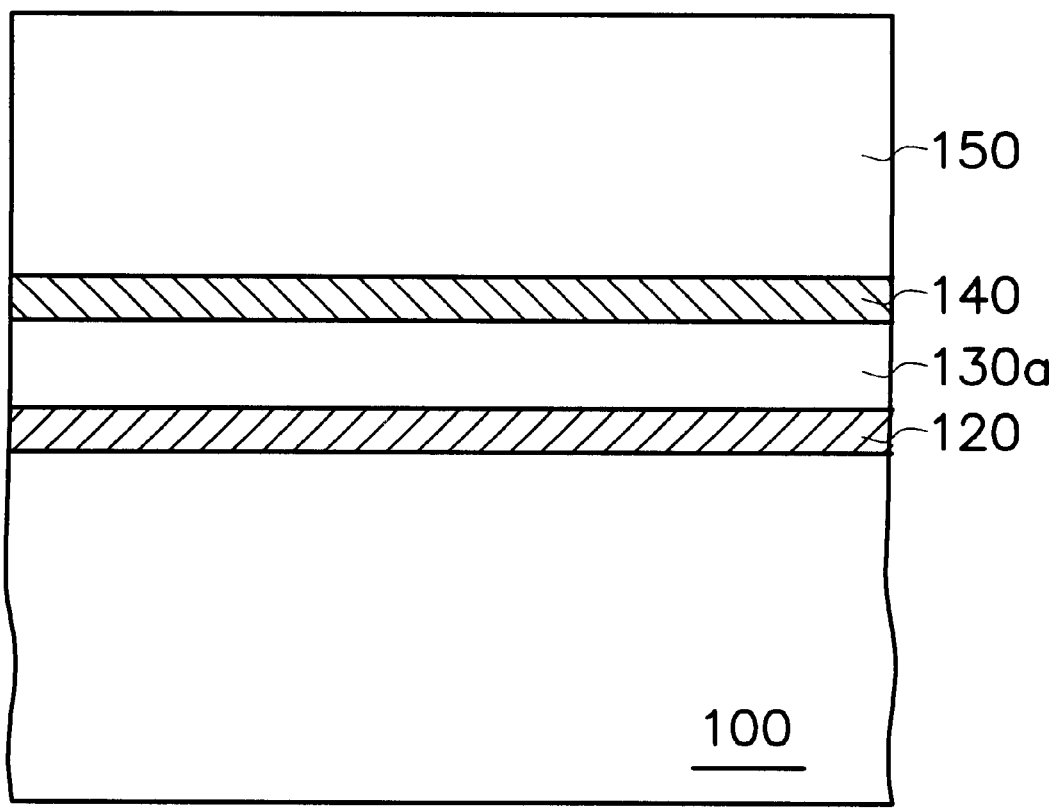

Referring to FIG. 8, in the subsequent step following the step of FIG. 7, a second electrode 150 is formed from polysilicon over the oxide layer 140 through, for example, a CVD process. In this CVD process, for example, a mixture of gaseous $SiH_4$ and $SiH_2Cl_2$, or a mixture of gaseous $Si_2H_6$ and $H_2$, is used as the reactant. This completes the fabrication of a DRAM data storage capacitor.

In conclusion, the method of the invention has the following advantages over the prior art.

First, the invention can help improve the structural quality of the silicon nitride layer, allowing the resultant silicon nitride layer to be formed substantially without a rugged surface with punctures. This not only can help solve the leakage problem of the prior art, but also can help further downsize the thickness of the silicon nitride layer, resulting in a larger capacitance for the DRAM data storage capacitor.

Second, by the invention, the step of forming a silicon oxide layer can be eliminated. Moreover, the thinning of the primitive oxide layer can also help downsize the overall thickness of the dielectric structure so that the capacitance of the resultant storage capacitor can be increased.

Third, by the invention, the use of rapid thermal treatment or nitrogen plasma treatment under low temperature conditions allows a low thermal budget to the fabrication of the storage capacitor and also helps to improve the short-channel effect between the source and drain of each transistor element in the DRAM that would otherwise occur due to multiple thermal treatment steps to the impurity-doped regions.

Fourth, the invention allows the overall fabrication process to be easier to carry out due to the fact that the step of performing the first nitridation process to the step of forming the second electrode can be all carried out on the same platform without having to redispose the wafer from the vacuum chamber.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a dielectric structure between a first electrode and a second electrode for a storage capacitor in DRAM, the first electrode being already formed with a primitive oxide layer thereon; the method comprising the steps of:

(1) removing the primitive oxide layer;

(2) performing a first nitridation process to form a dielectric layer over the first electrode;

(3) forming a layer of silicon nitride over the dielectric layer; and performing a second nitridation process on the silicon nitride layer to fill in punctures in the silicon nitride layer, with the resultant silicon nitride layer and the dielectric layer in combination constituting the intended dielectric structure.

2. The method of claim 1, wherein in the step (1), the removal of the primitive oxide layer is carried out by using an aqueous solution of hydrofluoric (HF) acid about 1% in concentration as etchant.

3. The method of claim 1, wherein the first nitridation process is carried out through rapid thermal treatment with the use of a reactant selected from the group consisting of nitrogen, ammonia, and a mixture of nitrogen and ammonia under a temperature of from 750° C. to 1,000° C. for a continuous period of from 30 to 90 seconds.

4. The method of claim 1, wherein the first nitridation process is a nitrogen plasma treatment process.

5. The method of claim 1, wherein the first nitridation process is a rapid-rising thermal treatment process with a rate of temperature change of 100° C./min until reaching a temperature level of from 700° C. to 850° C.

6. The method of claim 1, wherein the first nitridation process is a load-lock system nitridation process.

7. The method of claim 1, wherein the dielectric layer is formed from a dielectric material selected from the group consisting of silicon nitride, silicon-oxy-nitride, and a mixture of silicon nitride and silicon-oxy-nitride.

8. The method of claim 1, wherein the silicon nitride layer is formed through an LPCVD process.

9. The method of claim 1, wherein the second nitridation process is carried out through a rapid thermal treatment process with the use of a reactant selected from nitrogen, ammonia, and a mixture of nitrogen and ammonia under a temperature of from 800° C. to 1,000° C. for a continuous period of from 30 to 60 seconds.

10. The method of claim 1, wherein the second nitridation process is carried out through a nitrogen plasma treatment process under a temperature of from 400° C. to 600° C.

11. The method of claim 1, wherein the second electrode is formed from polysilicon over the dielectric structure through a CVD process with the use of a reactant selected from the group consisting of a mixture of $SiH_4$ and $SiH_2Cl_2$ and a mixture of $Si_2H_6$ and $H_2$.

12. The method of claim 1, further comprising the step of:

forming an oxide layer over the silicon nitride layer, with the dielectric layer, the silicon nitride layer, and the oxide layer in combination constituting an ONO structure serving as the intended dielectric structure.

13. The method of claim 12, wherein the oxide layer is formed through a rapid thermal process with a reactant selected from the group consisting of $N_2O$, $O_2$, and a mixture of $N_2O$ and $O_2$ under a temperature of from 800° C. to 900° C. for a continuous period of from 30 to 60 seconds.

14. The method of claim 12, wherein the second electrode is formed from polysilicon over the dielectric structure through a CVD process with the use of a reactant selected from the group consisting of a mixture of $SiH_4$ and $SiH_2Cl_2$ and a mixture of $Si_2H_6$ and $H_2$.

\* \* \* \* \*